United States Patent
Matsushita et al.

(10) Patent No.: US 7,538,038 B2
(45) Date of Patent: May 26, 2009

(54) METHOD OF REMOVING RESIST, SEMICONDUCTOR DEVICE THEREBY AND METHOD OF MANUFACTURING A SEMICONDUCTOR DEVICE

(75) Inventors: Atsushi Matsushita, Isahaya (JP); Isao Matsumoto, Nagaokakyo (JP); Kazuaki Inukai, Hamamatsu (JP); Hong Jae Shin, Seoul (KR); Naofumi Ohashi, Tokyo (JP); Shuji Sone, Tama (JP); Kaori Misawa, Kaizu-gun (JP)

(73) Assignee: Sony Corporation, Tokyo (JP)

(*) Notice: Subject to any disclaimer, the term of this patent is extended or adjusted under 35 U.S.C. 154(b) by 352 days.

(21) Appl. No.: 11/052,987

(22) Filed: Feb. 9, 2005

(65) Prior Publication Data

US 2005/0208756 A1   Sep. 22, 2005

(30) Foreign Application Priority Data

Mar. 16, 2004   (JP)   ............... 2004-074868

(51) Int. Cl.
 H01L 21/302 (2006.01)
 H01L 21/3065 (2006.01)
 H01L 21/461 (2006.01)
 H01L 21/47 (2006.01)

(52) U.S. Cl. ............... 438/710; 438/706; 438/725
(58) Field of Classification Search ............... 438/618, 438/622

See application file for complete search history.

(56) References Cited

U.S. PATENT DOCUMENTS

| 5,792,672 | A | * | 8/1998 | Chan et al. ............... 438/622 |
|---|---|---|---|---|
| 5,885,361 | A | | 3/1999 | Kikuchi et al. |
| 6,107,192 | A | | 8/2000 | Subrahmanyan et al. |
| 6,281,135 | B1 | | 8/2001 | Han et al. |
| 6,486,082 | B1 | | 11/2002 | Cho et al. |
| 6,583,046 | B1 | * | 6/2003 | Okada et al. ............... 438/622 |
| 6,635,409 | B1 | * | 10/2003 | Lyons et al. ............... 430/313 |
| 6,905,333 | B2 | | 6/2005 | Cox |
| 7,029,992 | B2 | * | 4/2006 | Shieh et al. ............... 438/474 |
| 2002/0005392 | A1 | | 1/2002 | Luo et al. |
| 2003/0054656 | A1 | * | 3/2003 | Soda ............... 438/710 |
| 2003/0216057 | A1 | * | 11/2003 | Hussein et al. ............... 438/780 |
| 2004/0029051 | A1 | * | 2/2004 | Koita et al. ............... 430/313 |
| 2004/0237997 | A1 | | 12/2004 | Rui et al. |

FOREIGN PATENT DOCUMENTS

| JP | 2-226722 | 9/1990 |
|---|---|---|
| JP | 2003-188151 | 7/2003 |
| JP | 2004-103747 | 4/2004 |

* cited by examiner

*Primary Examiner*—N Drew Richards
*Assistant Examiner*—Pamela E Perkins
(74) *Attorney, Agent, or Firm*—Oblon, Spivak, McClelland, Maier & Neustadt, P.C.

(57) ABSTRACT

Disclosed is a method of removing resist preventing increase of dielectric constant of low permittivity insulating films and preventing remains of resist. Using a resist mask, a protection insulating film, a MSQ film, and a silicon oxide film composing an ILD are RIE dry etched sequentially, and a via is formed on the surface of a substrate for processing reaching the diffusion layer on the substrate for processing. Subsequent process consists of; removing a modified layer formed on the substrate for processing surface because of prior etching using plasma gas by plasma excitation of $NH_3$ gas, and another etching for complete removal of the resist mask by irradiation of hydrogen active species created by hydrogen gas and inert gas, of which example is helium gas or argon gas.

18 Claims, 10 Drawing Sheets (MSQ film)

The resist mask is removed.

(MSQ film)

US 7,538,038 B2

METHOD OF REMOVING RESIST, SEMICONDUCTOR DEVICE THEREBY AND METHOD OF MANUFACTURING A SEMICONDUCTOR DEVICE

TECHNICAL FIELD

This invention relates to method of removing resist, semiconductor device thereby and method of manufacturing a semiconductor device using the method of removing resist. More particularly but not exclusively, the invention relates to a method, in removing the film of resist coated onto a substrate, to prevent rising of dielectric constant of an inter-layer dielectric (ILD) which consists of low dielectric constant insulating film materials, and a method to remove resist completely without leaving residue. The invention also involves semiconductor device manufactured according to the method.

BACKGROUND OF THE INVENTION

Today, semiconductor manufacturing especially of a very large scale integrated circuit (VLSI) that is formed on a silicon substrate, indispensably entails micro fabrication of elements or circuit components and forming multilayer interconnect wiring to bond the elements. As operation at lower voltages and higher processing speed are required for more semiconductor devices, imperative is reducing dielectric constant of the ILD among the multilayer interconnect wiring. Particularly in manufacturing logic integrated circuits (ICs), a problem is decrease of processing speed of ICs caused by increase of resistance and increase of parasitic capacitance as a result of microscopic wiring onto the ILD. A solution is to apply insulating film materials of low dielectric constant to the ILD for multilayer interconnect wiring structure. The low dielectric constant insulating film means here an insulating film of which dielectric constant is less than four (4) which is dielectric constant of silicon dioxide.

Other low dielectric constant insulating films are an insulating film of siloxanes backbone, an insulating film of organic polymer molecule for main chain, and a porous insulating films of these two kinds of materials. Dielectric constant of the insulating films of siloxanes backbone is less than three (3). Those films are a silica film which consists of at least one (1) of Si—$CH_3$ bonding, Si—H bonding, and Si—F bonding as of silsesquioxane insulating films and a film of silicon oxide with carbon (SiOC film).

An example of the insulating film material of organic polymer for main chain is well-known SiLK (registered trademark). Dielectric constant of this type of films is generally lower than that of the insulating films of siloxanes backbone.

Well-known insulating materials for silsesquioxane insulating films are Methyl Silsesquioxane (MSQ), Hydrogen Silsesquioxane (HSQ), and Methylated Hydrogen Silsesquioxane (MHSQ). By making those silsesquioxane insulating films porous, dielectric constant can be easily two (2) to three (3).

Process by use of a mask of resist is essential to apply abovementioned insulating materials of low dielectric constant to an ILD and to form multilayer interconnect wiring onto a substrate. Such processing includes, for example, forming a via (hole) to connect between multilayer interconnects, or forming wiring trench(es) for buried wiring (damascene wiring or dual damascene wiring). Now, explained is outline of the process to make a via onto insulating films of low dielectric constant referring to FIG. 9A-9D in the appended drawings. FIG. 9A-9D depicts a modeling cross section of an ILD with a via in the order of process sequence.

As shown in FIG. 9A, on the surface of a P-conductive (for an instance) silicon substrate 101, an n-conductive diffusion layer 102 is formed; and on the surface of the silicon substrate 101, a silicon oxide film 103 is formed in 50 nm thickness, for instance, by thermal oxidation. Then, on the silicon oxide film 103, a MSQ film 104 about 1.5 μm thick is formed by widely-known spin-on coating method, and laminating on the MSQ film 104, a protection insulating film 105 is made. In this case the protection film 105 is a silicon carbide (SiC) film of 50 nm thickness. Thus, in this case of process, the protection insulating film 105, the MSQ film 104, and the silicon oxide film 103 together constitute the ILD 106. Subsequently, by photolithography a resist mask 108 is formed on the protection insulating film 105 with an opening 107 on the designated area of the resist mask.

Next, as shown in FIG. 9B, the ILD is dry etched in reactive ion etching (RIE) utilizing the resist mask 108 for the etchingmask. Firstly, the protection insulating film 105 is etched in RIE by plasma excitation of $CF_4$ gas. Secondly, the MSQ film 104 and the silicon oxide film 103 are etched in RIE by plasma excitation of the mixture of $C_4F_8$ gas, $N_2$ gas, and Argon gas. Thus, a via 109 reaching the diffusion layer 102 is made out. In this process of dry etching, depending on RIE conditions, the surface of the resist mask 108 is heat affected by the impact of plasma ion and a modified layer 108a is formed there.

Subsequent process is removing the resist mask 108 including the modified layer 108a. As in FIG. 9C, active species of hydrogen is created by plasma exciting the mixed gas of hydrogen ($H_2$) and inert gas (example: He, Ar) in a resist removing apparatus, and the resist mask 108 including the modified layer 108a is removed by irradiation of hydrogen atoms, which are derived from the hydrogen active species by excluding hydrogen molecular ion, or by irradiation of hydrogen radical III of hydrogen molecules. Resist removing above indicated is processed using a removing apparatus of which modeling illustration is given in FIG. 5, which shall be explained later. Time required for removing resist is one (1) to two (2) minutes including time for about 30% over etching. Time taken for resist removing varies depending on the thickness of a resist film, and over etching time varies according to the difference in level of front-end.

Consequently, as shown in FIG. 9D, the via 109, which reaches the diffusion layer 102 formed on the surface of the silicon substrate 101, is made through the multilayer of the ILD 106 consisting of the protection insulating film 105, the MSQ film 104, and the silicon oxide film 103. Then conductive material (via plug) is filled into the via 109, and the interconnect wiring layer is structured, though this specific part of the process is not illustrated in the drawing.

SUMMARY OF THE INVENTION

The objective of this invention is to realize a method of removing resist in a way preventing increase of dielectric constant in the low permittivity insulating films, and a method of removing resist not leaving residue, without depending on RIE conditions in the process of removing a resist mask by plasma etching; for manufacturing semiconductor devices utilizing insulating films of low dielectric constant.

To achieve the above objective, this invention that relates to the method of removal by etching of resist used as a mask for patterning the substrate, involves two processes: one, for etching removal of resist on the surface of the resist film which is modified by the abovementioned process, described in above 0006; and another, for etching removal of residual resist film after the surface is removed, by using hydrogen active species created by plasma excitation of gas including hydrogen gas.

EFFECT OF THE INVENTION

Application of the resist removal method by this invention enables to form a low dielectric constant ILD for wiring structure of semiconductor devices conveniently in high repeatability and accuracy. Resist removing by use of hydrogen gas realizes complete removal of resist, leaving none of residue. The invention presents the method of resist removing by hydrogen gas, which method is potentially and effectively applicable to manufacture of semiconductor devices.

DETAILED DESCRIPTION OF THE PREFERRED EMBODIMENTS

Figure 10:
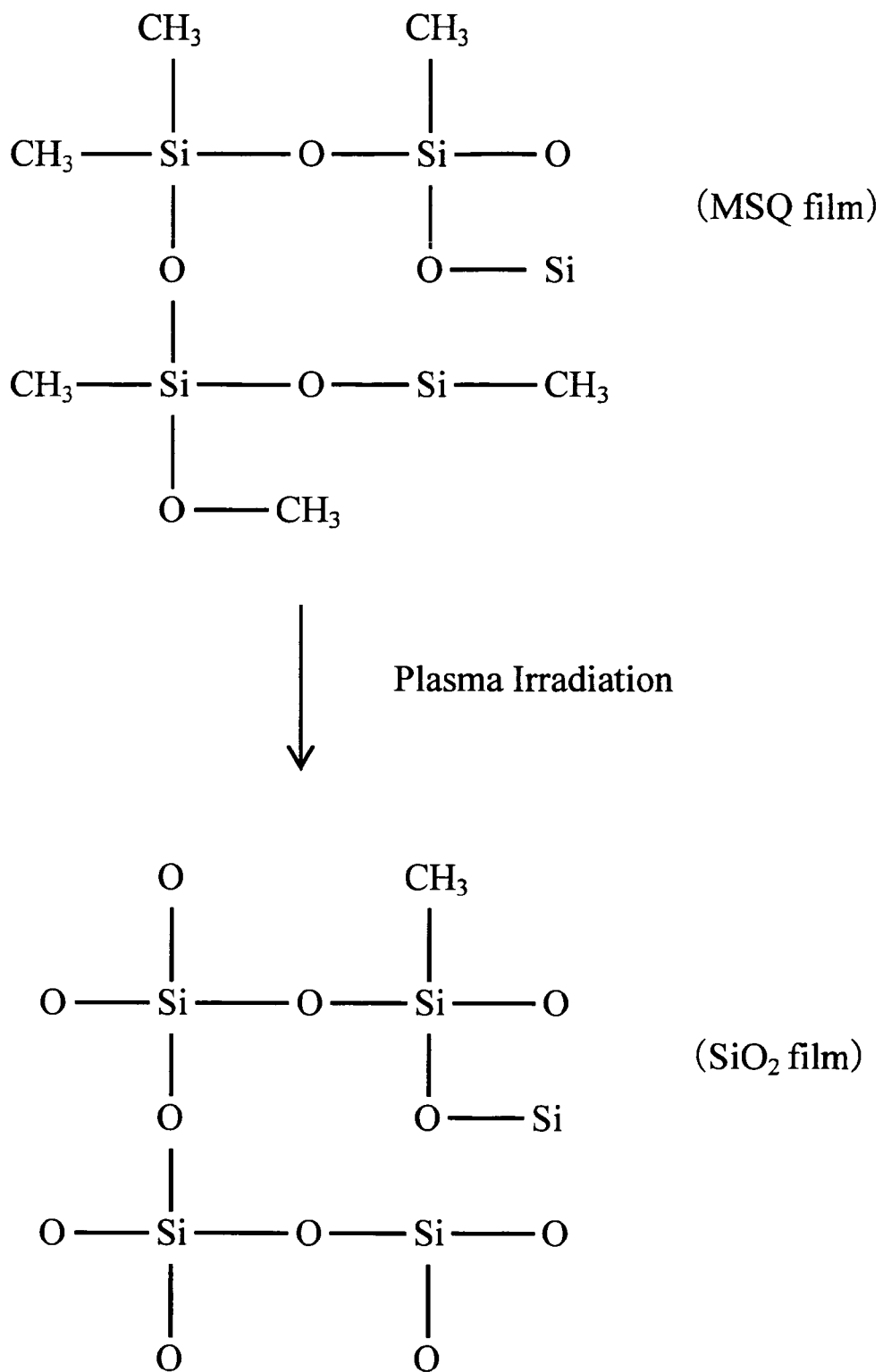
FIG. 10 gives a structural diagram of a low dielectric constant insulating film to explain conventional technology.

In conventional manufacture of semiconductor devices, removal of a resist mask used for an etching mask has been done by plasma ashing by plasma excitation of mixed gas of oxygen gas (O2) and halide gas. However, that method incurs increase of dielectric constant of the insulating films for an ILD, such as a MSQ film of which composition is [$CH_3SiO_{3/2}$]n containing organic property, because the film modifies in its characteristic after ashing by plasma irradiation and dielectric constant rises in the film. This problem refers to FIG. 10 which describes a modeling structural diagram for modification of the MSQ film by oxygen plasma ashing. When active species of intense oxidation property, such as oxygen ion or oxygen radical, is plasma irradiated onto the surface of a MSQ film, the bonding Si—$CH_3$ shifts to Si—O as shown in the diagram. In this way a compositional change occurs on the surface of the MSQ film, and a silicon dioxide ($SiO_2$) film is partially formed, whereby causing significant increase of the film's dielectric constant. This film modification by oxygen plasma ashing becomes more conspicuous during over etching of the resist mask. This modification is prevalent in low dielectric constant insulating films as a whole when they are processed by plasma ashing.

Because of the above problem, hydrogen gas or mixture with inert gas must be used instead of oxygen gas for plasma irradiation in removing resist. By this way no compositional change of a MSQ film surface is caused and increase of dielectric constant is completely prevented.

Figure 9A:
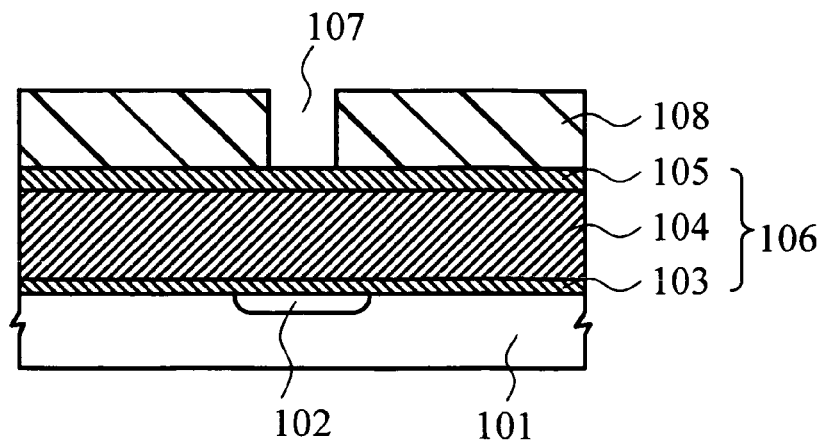
FIG. 9A-9D is process-wise cross sectional views indicating a resist removing method by conventional technology.
Figure 9B:
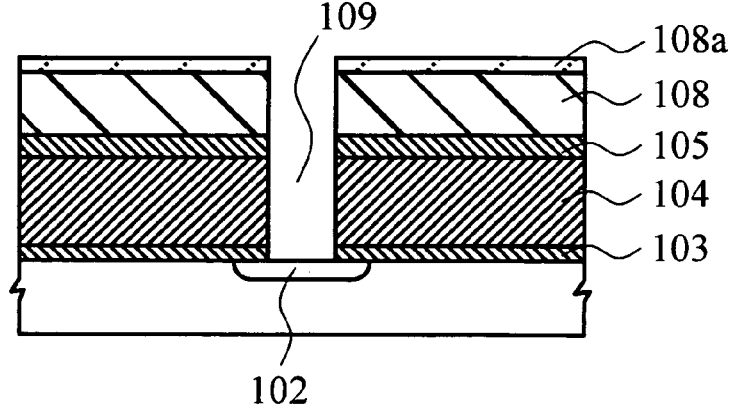
Figure 9C:
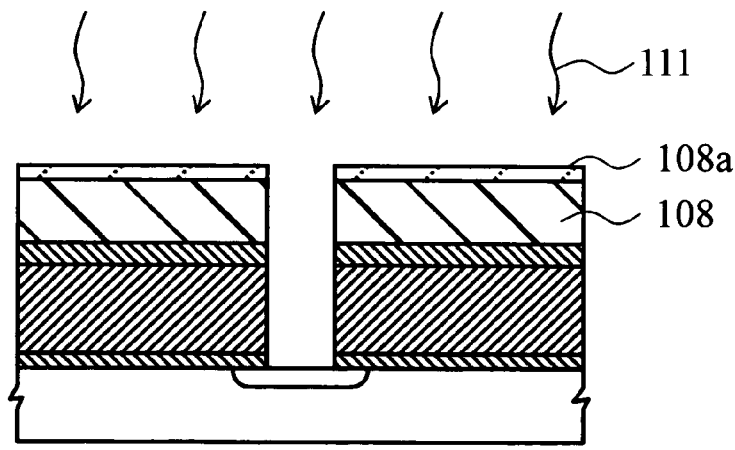
Figure 9D:
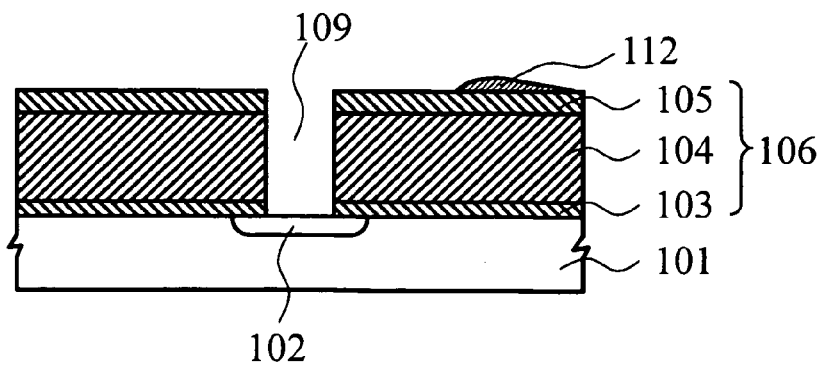

One problem the inventor encountered was that, as shown in FIG. 9D, in resist removing by mixed gas of hydrogen gas and inert gas, resist 112 remained on the surface of the ILD 106 and that the resist mask 108 was not completely removed due to residual resist. Remaining of resist 112 was due to conditions of dry etching in RIE in processing the substrate as shown in FIG. 9B.

The inventor's detailed study of the problem revealed its cause in two (2) cases wherein formation of residual resist 112 was incited intensively.

First case is when progressive thermosetting of the resist mask due to long duration exposed to an impact of plasma ion in the surface of the resist mask 108; a longer time was taken for dry etching of the ILD in RIE, because the processed ILD was relatively thick.

And second case is when formation of foreign particles was caused on the surface of the resist mask 108 as a result of chemical reaction between resist and halide gas (halogen, fluorine, chlorine, bromine) which was plasma excited in RIE for processing gas. It was found that the modified layer 108a consists of either or both of two layers, a thermoset layer and another foreign particle layer, to categorize broadly.

This invention was made in the light of facts and findings explained above. The invention presents the method of removing resist not only preventing increase of dielectric constant of a low dielectric constant insulating film, but also leaving none of residual resist, irrelevant to RIE conditions in plasma irradiation of hydrogen gas.

Now, a few examples of embodiment of this invention will be explained in detail with reference to the drawings.

Embodiment 1

FIG. 1A-1D, FIG. 2A-2C and FIG. 3A-3C describe process-wise cross sectional views of a substrate with an ILD and a protection film and a resist mask thereon to explain the example of embodying this invention.

Figure 1A:
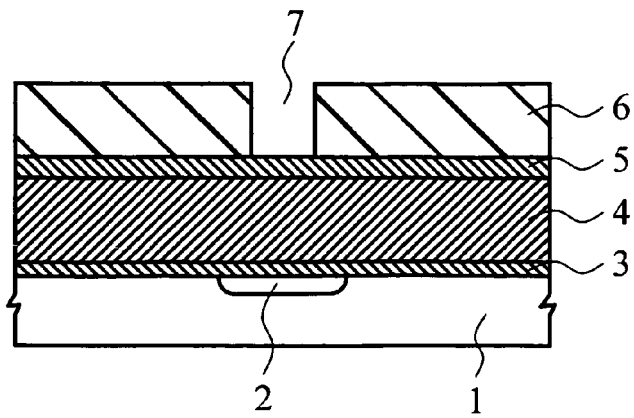
FIG. 1A-1D are process-wise cross sectional views of a semiconductor device to explain the resist removing method in the embodiment of the first part of this invention.

Firstly an n-conductive diffusion layer 2 is formed on the surface of a p-conductive silicon substrate 1, and on the surface of the same substrate a silicon oxide film 3 of 50 nm thickness, for instance, by thermal oxidation. Then, on the silicon oxide film 3, a MSQ film 4 of approximate 1.5 μm is made by widely known spin-on coating method. And, laminating a SiC film 50 nm thick on the MSQ film 4, a protection insulating film 5 is formed. Further, a resist mask 6 is made on the protection insulating film 5 on the substrate by photolithography technology. An opening 7 is formed on the resist mask 6. (FIG. 1A).

Figure 1B:
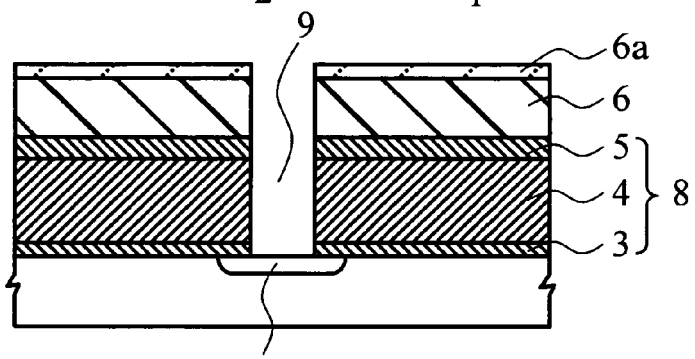

Next, as explained in the above referring to conventional technology, an ILD 8 consisting of the protection insulating film 5, the MSQ film 4, and the silicon oxide film 3, is formed by; dry etching in RIE of aforementioned three films sequentially; firstly, the protection insulating film 5 by plasma excitation of $CF_4$ gas, secondly, the MSQ film 4, and thirdly, the silicon oxide film 3, last two by plasma excitation of the mixture of $C_4F_8$ gas, $N_2$ gas, and Ar gas. Thus a via 9 reaching the diffusion layer 2 is made out. Due to those dry etching processes, a modified layer 6a is formed on the surface of the resist mask 6. (FIG. 1B). This modified layer 6a is the mixture of a thermoset layer partly and partly a foreign particle layer as explained in the above.

Figure 1C:
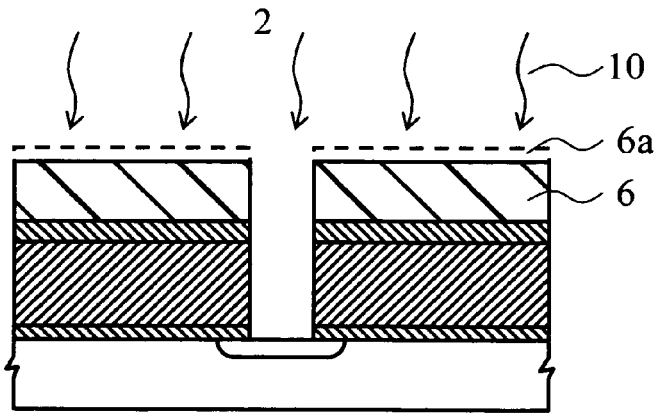
Figure 4:
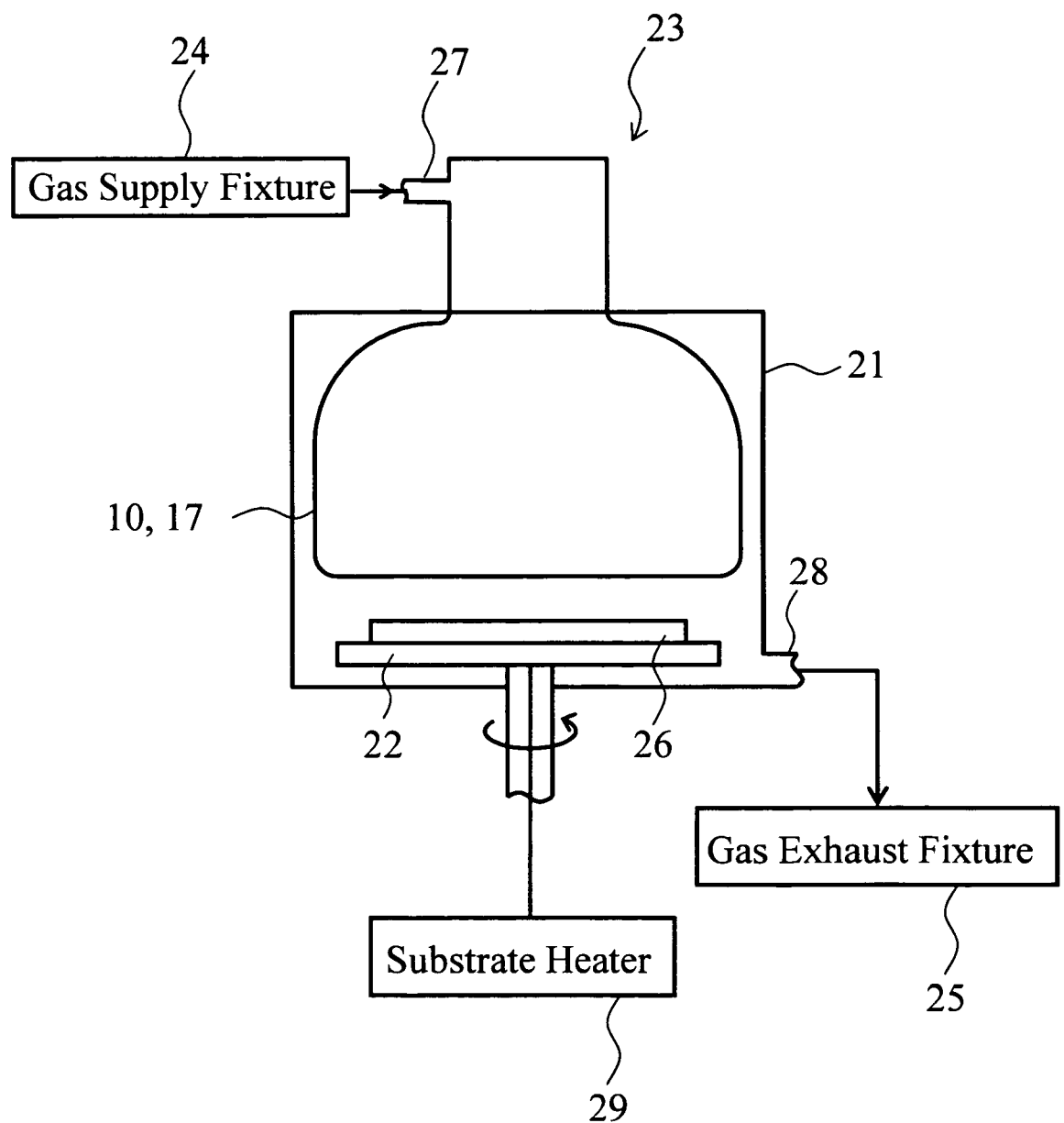
FIG. 4 is a modeling illustration of outline of the resist removing apparatus to remove resist of the modified layer on the surface of the resist mask.

Then, using a resist removing apparatus as illustrated in FIG. 4, the modified layer 6a is removed by plasma etching by irradiation of plasma gas 10. (FIG. 1C). This resist removing apparatus is composed of, for its basic structure; a chamber 21 made of cylindrically formed anodized aluminum wall, a revolving plate 22 attached to the inside bottom of the chamber 21, and a gas supply fixture 24 to supply $NH_3$ gas, $N_2$ gas, $H_2$ gas, $CF_4$ gas, $O_2$ gas, and inert gas, and an exhaust fixture 25 to discharge gas after reaction and processing out of the chamber 21. The plasma generator 23 is equipped with those devices: a Helicon wave plasma oscillator, an Electron Cyclotron Resonance (ECR) plasma oscillator, an Inductively Coupled Plasma (ICP) oscillator for generating high density plasma (HDP).

Next, the wafer that is the silicon substrate 1 itself is placed on the revolving plate 22 of the resist removing apparatus, the plate 22 being revolved at certain constant speed; and processing gas, either $NH_3$ or the mixture of $NH_3$ and inert gas is introduced from a gas intake 27 into the plasma generator 23; and active species of nitrogen and hydrogen are created in abundance by plasma excitation of aforementioned processing gas by the HDP oscillators indicated in the above [0020]. Then, introducing created active species into the chamber 21, and by irradiation of plasma gas 10 onto the wafer 26, as shown in FIG. 1, (c), the modified layer 6a is removed and the resist mask 6 remains in its place. Processing gas is discharged out of the chamber 21 from an outlet 28 through the exhaust 25 after the removal of the modified layer 6a. For the process described here, temperature of the wafer 26 is set at about 100° C. with a substrate heater 29 which directly heats the revolving plate 22 and controls temperature of the plate and the wafer.

Time for removing the modified layer 6a is about 15 seconds, which is very short in comparison with one (1) to two (2) minutes required for removing by conventional technology.

Figure 1D:
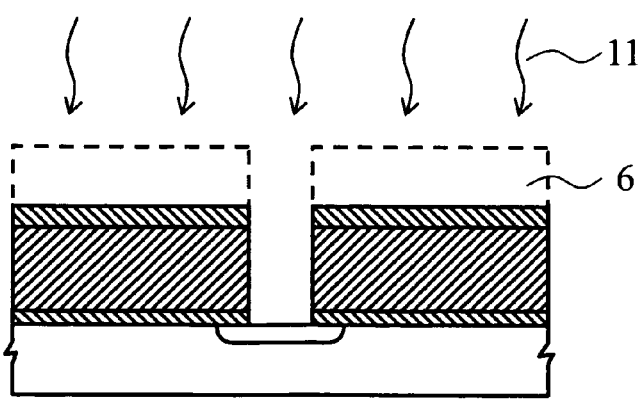
Figure 5:
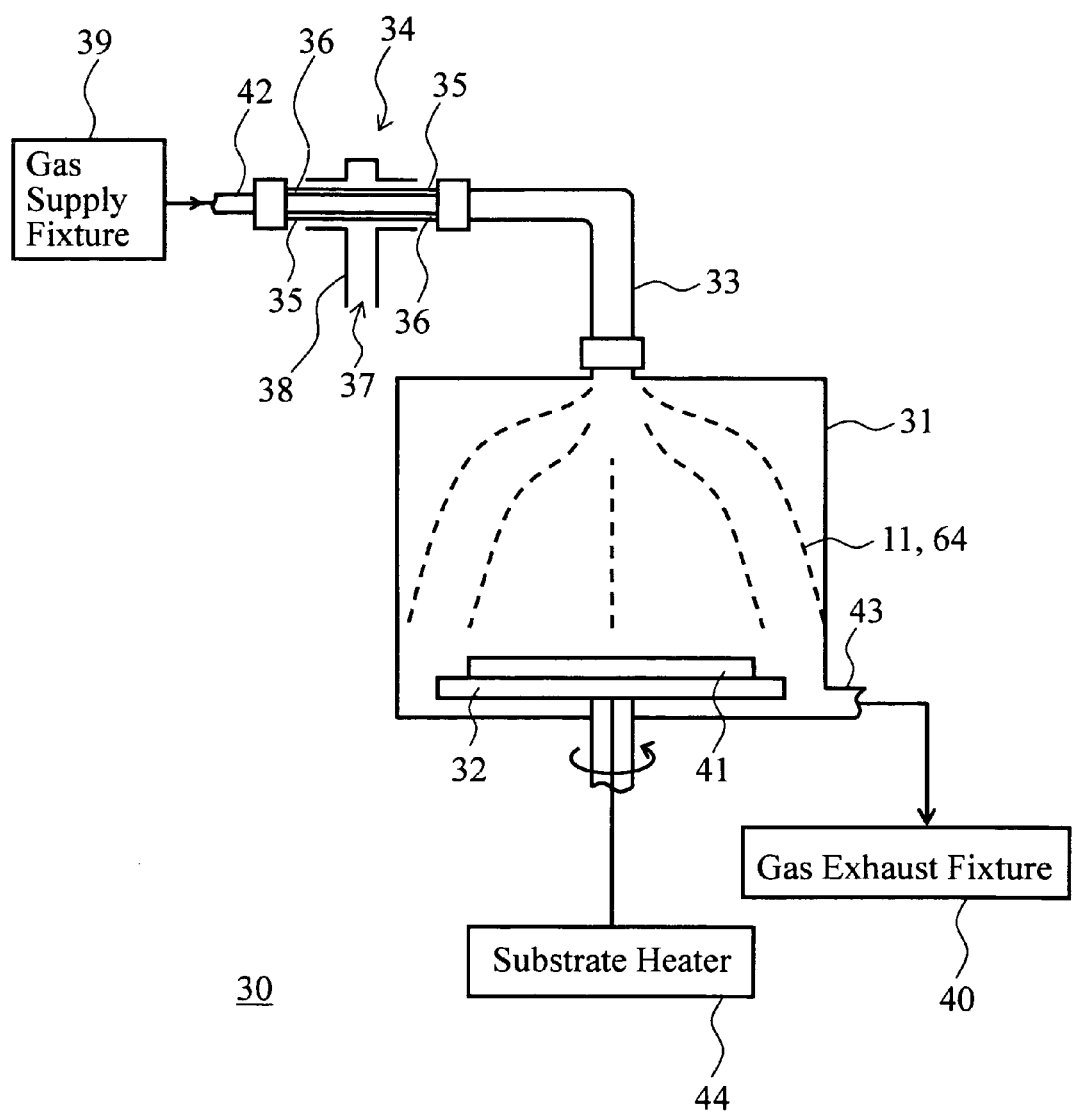
FIG. 5 is a modeling illustration of outline of the resist removing apparatus to remove the resist mask after the above process.

Next, as explained referring to conventional technology, the resist mask 6 is removed using another resist removing apparatus as shown in FIG. 5 by irradiation of hydrogen radical 11 (FIG. 1D). This resist removing apparatus 30 consists of as its basic structure; a chamber 31 made of cylindrically formed anodized aluminum wall, a revolving plate 32 attached to the inside bottom of the chamber 31, a gas introduction pipe 33, the pipe fixed onto the inside top of the chamber 31, to transport active species, a plasma generator 34, and a gas supplier 39 to supply hydrogen gas or inert gas (He, Ar), and an exhaust 40 to discharge processing gas out of the chamber 3 after reaction.

The plasma generator 34 consists of a gas-discharge tube 35 made of quartz glass, for instance, and with plasma-resistant material over the inner wall of the tube. Inside this gas-discharge tube, connected is a waveguide 38 for transmission of μ wave (frequency 2.45 GHz for instance) into the gas-discharge tube 35. Plasma-resistant material 36 may be also applied onto the inner wall of the gas introduction pipe 33. Preferable is material resistant to sputtering.

The wafer of the substrate 1 being placed on the revolving plate 32, and the plate being revolved at a certain constant speed, mixed hydrogen gas, which is produced by dilution of hydrogen gas with He gas, is introduced into the gas-discharge tube 35 from the gas intake 42, μ wave 37 oscillated from a magnetron is transmitted into the gas-discharge tube 35 through the waveguide 38, and hydrogen active species are created by plasma excitation of abovementioned mixed hydrogen gas. Here it might be noted that hydrogen active species includes proton which constitutes hydrogen plasma, hydrogen molecular ion, and hydrogen atom or neutral radical of hydrogen molecule (last two called hydrogen radical together).

Among those active species, hydrogen radical keeps alive long in duration, and hydrogen radical develops to hydrogen radical 11 being introduced into the chamber 31 through the gas introduction pipe 31 as shown in FIG. 1D, and this hydrogen radical 11 acts to remove the resist mask 6 on the surface of the wafer 41 placed on the revolving plate 32. Removing the resist mask 6 is processed taking additional time for 30% over etching. Hydrogen plasma partially transforms to hydrogen radical 1 during transportation through the gas introduction pipe 33. Subsequently processing gas is discharged out of the chamber 31 from the gas outlet 43 though the exhaust 40.

As plasma excitation of mixed hydrogen gas creates high density of plasma as microwave is used therein; density of hydrogen radical is high increasing speed of resist removing. The wafer 41 is placed in temperature set in a range of 200° C. to 400° C. by heating the revolving plate 32 with the thermostatic substrate heater 44. Wafer temperature of 200° C. to 400° C. is higher than wafer temperature applied in resist removing by conventional method using plasma, which is normally about 150° C. or lower than that.

Application of higher wafer temperature than that in conventional method further increases speed of resist removing.

Figure 2A:
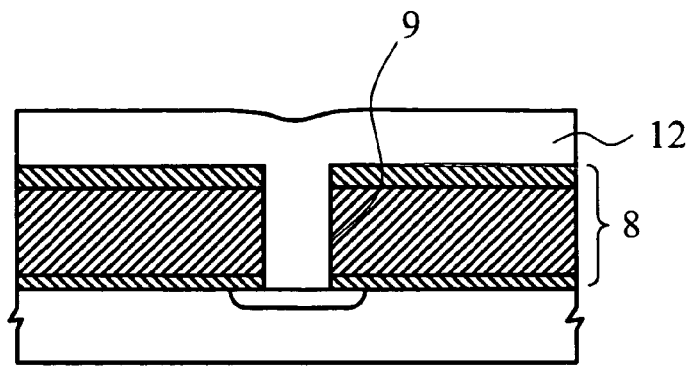
FIG. 2A-2C are process-wise cross sectional views of the processes subsequent to those in FIG. 1.

Subsequently, by chemical vapor deposition (CVD) method a conductive film 12 is laminated on the ILD layer 8 to fill the via 9. (FIG. 2A). The conductive film 12 is a laminate of titanium barrier metal and high melting point metal such as tungsten or silicide with it.

Figure 2B:
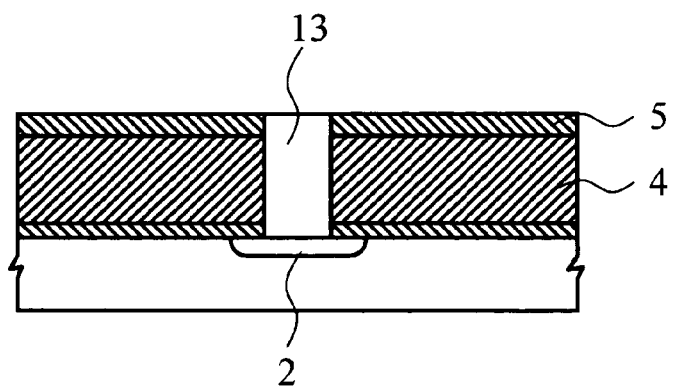

Then, by widely known chemical mechanical polishing (CMP) method, polished and removed is unnecessary part of the conductive film 12 on the protection insulating film 5. In this CMP process, the protection film 5 acts as a CMP stopper film and protects the MSQ film 4 from CMP. Thus a via plug 13 is made out, which connects to the diffusion layer 2. (FIG. 2B)

Figure 2C:
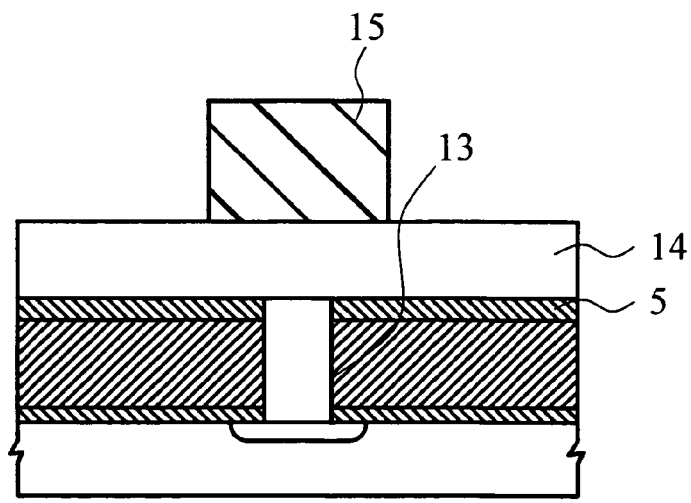

Then, by sputtering onto the protection insulating film 5, an aluminum and copper alloy film 14 of about of 1 μm thickness is formed; the film 14 contacts the via plug 13, and a resist mask 15 of a wiring pattern is formed on the surface of the aluminum and copper alloy film 14 by photolithography. (FIG. 2C)

Next, a layer of wiring pattern 16 is formed by RIE dry etching of the aluminum and copper alloy film 14 using the resist mask 15 for the etching mask. For dry etching of the aluminum and copper alloy film 14, mixed gas containing chlorine such as $Cl_2$ gas or $BCl_3$ gas is used b y plasma excitation. On the resist mask 15 formed is a modified layer 15a which is thermoset organic polymer containing chlorine. (FIG. 3A) Major part of the modified layer 15a is foreign particle layer indicated in the above.

Figure 3A:
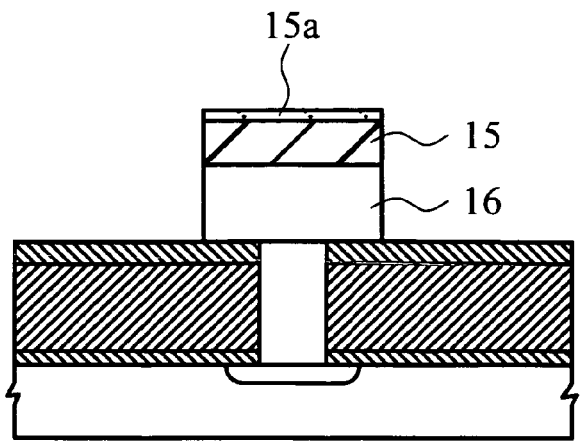
FIG. 3A-3C are process-wise cross sectional views following FIG. 2A-2C.
Figure 3B:
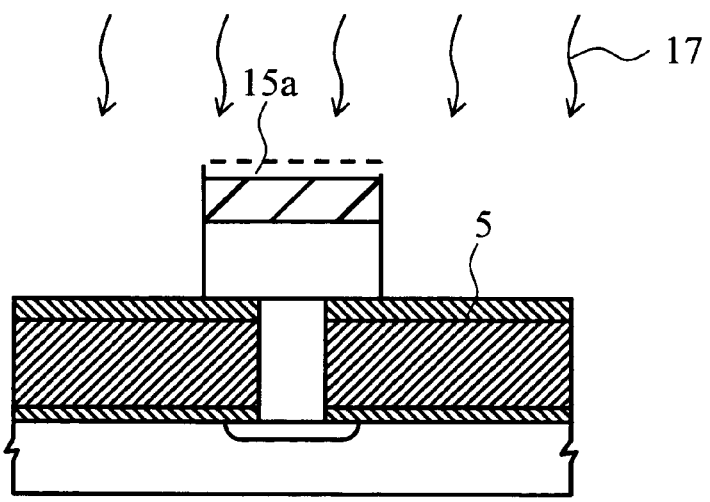

The modified layer 15a is removed by plasma etching in such a short time as about 15 seconds using the resist removing apparatus as shown in FIG. 1B (FIG. 3B). Processing gas for removing the modified layer 15a is mixture of $CF_4$ gas and $O_2$ gas. Because the modified layer 15a is composed of mainly foreign particle layer, plasma removing of the layer 15a is more critical than removing the modified layer 6a; so here used is ashing gas mentioned before. By use of ashing gas, the protection insulating film consisting of SiC film is safe guarded from etching removal unlike the case of using $NH_3$ gas.

Figure 3C:
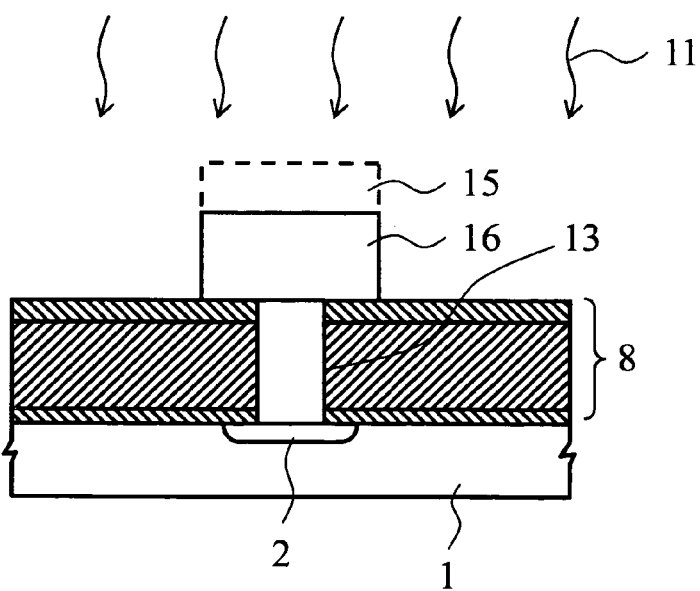

Next, as explained as to FIG. 1D, the resist mask 15 is removed by irradiation of oxygen radical 11 using the resist removing apparatus shown in FIG. 5. Thus the layer of wiring pattern 16 is discretely and functionally structured being connected with the diffusion layer 2 formed on the surface of the silicon substrate through the via plug 13 made in the ILD 8. (FIG. 3C)

The method of removing resist explained here ensures complete removal of resist in high repeatability and stability. However, in order to remove a modified layer on the surface of a resist mask prior to subsequent process, gas for plasma processing has to fit for the character of a film to be etched, because film modifies in its character depending on RIE conditions. Normally, most difficult is removing the modified layer of a metal film formed by RIE etching. Therefore, in this case ashing gas is added to processing gas. For etching of films of other materials than metal, useable is either of $NH_3$ gas, $N_2$ gas, $H_2$ gas, $CF_4$ gas or mixture of these. Applicable kinds of mixed gas are $NH_3$ gas to which $CF_4$ gas is added, $N_2$ gas plus $CF_4$ gas, $H_2$ gas plus $CF_4$ gas, $N_2$ gas plus $H_2$ gas, or $NH_3$ gas plus $O_2$ gas.

By applying the method of removing resist indicated before here, dielectric constant can be maintained low after resist is removed. For example, in case the porous MSQ film 4, which dielectric constant is 2.5, is used in forming the ILD as explained as to FIG. 1, the dielectric constant of the MSQ film 4 tends to rise a little after the process shown in FIG. 3D, however the ratio of increase of dielectric constant is less than one (1) % even taking into account experimental error. In this embodiment example, the ILD insulating film 8 is the laminate of the protection insulating film 5, the MSQ film 4, and the silicon oxide film 3. Provided that dielectric constant of the SiC film, which composes the protection insulating film 5, is 3.5 (three and half) and that the same constant of the silicon oxide film 3 is 4 (four), thickness of the ILD 8 becomes a little less than 1.6 µm in conversion to thickness of the MSQ film.

Being dielectric constant such low, the method of this invention proves capability of forming wiring structure in reduced parasitic capacitance among the wires to enough necessary extent in manufacturing semiconductor devices.

Figure 6:
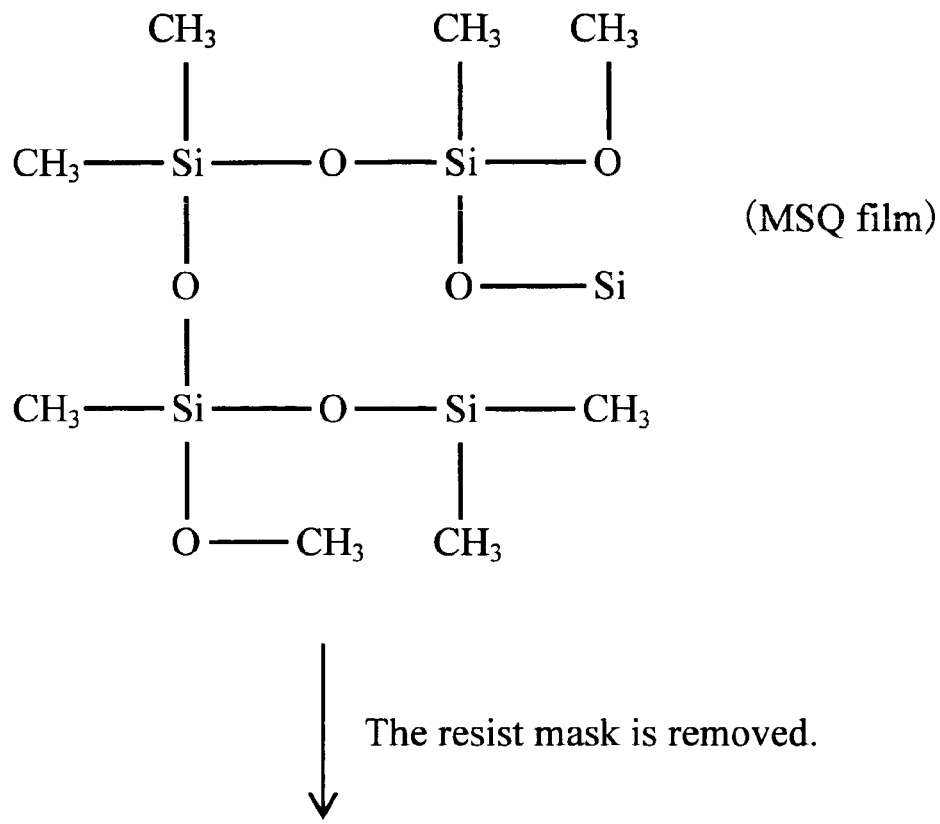
FIG. 6 is a structural diagram of a low dielectric constant insulating film to explain advantage of this invention.
Figure 6:
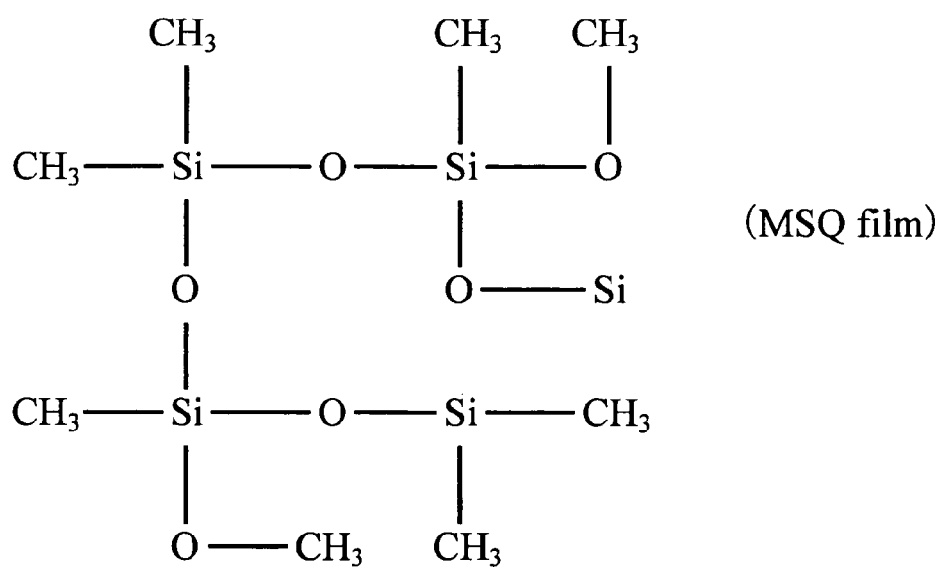

In this example of embodying the invention, dielectric constant of the MSQ film 4 hardly varies during process, reason being short time of plasma irradiation on the surface of the resist mask and the ILD 8 being covered with the resist mask 6. Another reason is that the property of the MSQ film hardly modifies since methyl group ($—CH_3$) in the MSQ films remains as it is, in spite of irradiation of hydrogen radical for a long time including over etching time, as shown in FIG. 6. The FIG. 6 is a modeling structural view of the MSQ film based according to the result of x-ray Photoelectron Spectroscopy (XPS) measurement.

As seen from the above explanation, features of this embodying example are preliminary removal of a modified layer by plasma irradiation for short time on the surface of a resist mask and subsequent removal of the remaining resist mask by hydrogen radical produced from hydrogen-contained gas by remote plasma process.

As this embodying example 1 demonstrates, complete removal of residual resist, which is very difficult by conventional technology is realized in high repeatability and stability. Also prevented is increase of dielectric constant of low dielectric constant insulating films after removal of resist, thus enabling to form an ILD of low dielectric constant conveniently and highly accurately for wiring structure of semiconductor devices: high repeatability and stability of processing and results. Thus, convenient method of forming wiring structure of small parasitic capacitance, with an ILD of less than 3 (three) permittivity for semiconductor devices will promote practical and general use of high processing speed and high performance semiconductor devices.

Embodiment 2

FIG. 7A-7C and FIG. 8A-8C depict process-wise cross sectional views of a semiconductor device to which applied is a resist removing method in the example 2 of embodying this invention. The example 2 is the case of forming dual damascene wiring structure.

Firstly, on the surface of a silicon substrate (drawing not shown) formed is a base insulating film 51 of silicon oxide film; on the base insulating film 51 formed is 1st barrier layer 52 of titanium-related conductive material; on the layer 52, a lower wiring layer 53 of aluminum and copper alloy film; on the layer 53, $2^{nd}$ barrier layer 54, four layers in laminate. Then, solution which is to be a MSQ film is coated over the whole surface by spin-on coating method, and then the substrate with four films thereon is sintered in temperature of about 150° C., for instance, and moreover, by heat treatment in about 400° C. in a diffusion furnace, $1^{st}$ MSQ film 55 is formed in about 500 nm thickness. Subsequently, on the surface of 1st MSQ film 55, 1st protection insulating film 56 of silicon carbide (SiC) film 50 nm thick is formed, and on the surface thereof an opening 57 is made by selective etching. Then, on the film 56, $2^{nd}$ MSQ film 58 of 1 µm thickness by spin-on coating; and on the film 58, an insulating film 59 of 50 nm SiC film by the same way; the four films are formed in laminate; the preliminary process of the substrate is thus completed. Then a resist mask 60 is made on the $2^{nd}$ protection film 59 by photolithography. A resist opening 61 is formed on the resist mask 60.

Figure 7A:
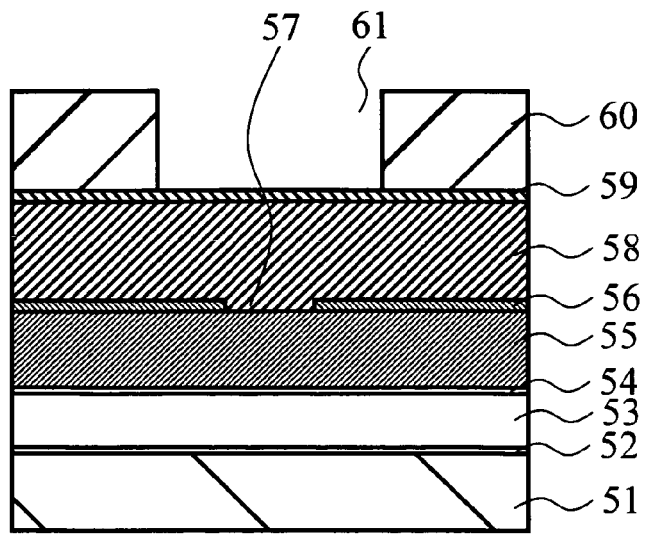
FIG. 7A-7C are process-wise cross sectional views of a semiconductor device to indicate the resist removing method in the embodiment of the second part of this invention.
Figure 7B:
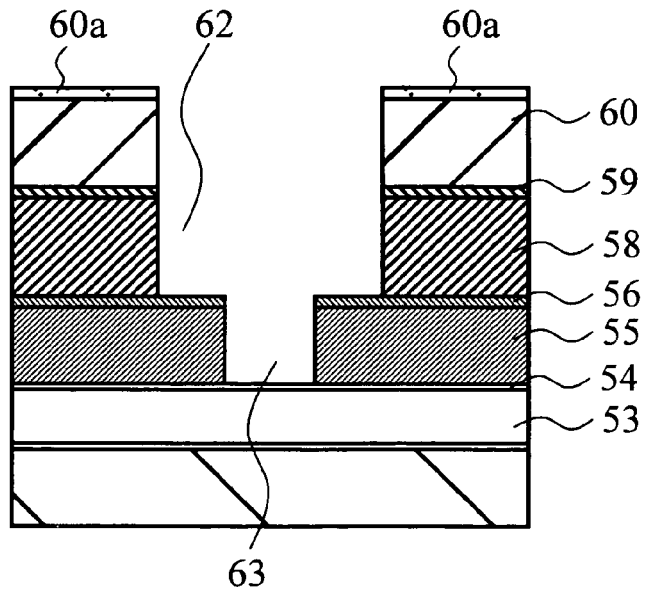
Figure 7C:
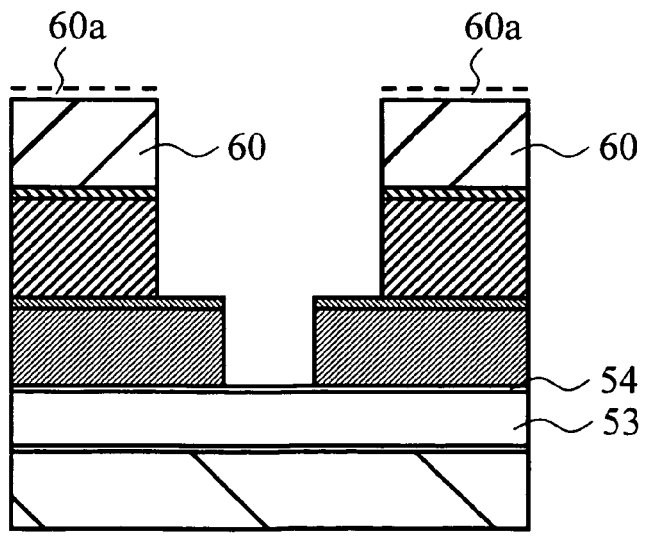

Next, using the resist mask 60 for the etching mask, firstly the $2^{nd}$ protection insulating film 59 is etched in RIE by plasma excitation of CF4 gas; the 2nd MSQ film 58 by plasma excitation of the mixture of C4F8 gas, O2 gas, and Ar gas; the first MSQ film 55 under the opening 57 is dry etched using the $1^{st}$ protection film 56 for etching stopper. As a result, a wiring trench 62 is made onto the 2nd protection insulating film 59, and a via hole 63 is made onto the 1st MSQ film 55 and the 1st protection insulating film 56. By dry etching described in above, a modified layer 60a is formed on the surface of the resist mask 60. (FIG. 7B)

The modified layer in this case is smaller in volume and easier to be removed by etching than the modified layer in the example 1, reason being that $O_2$ is added to processing gas and the surface of the resist mask 60 is also ashing removed at the same time during dry etching.

Then the modified layer 60a formed on the surface of the resist mask 60 is removed by chemical solution. (FIG. 7C) It is preferable to use chemical solution that does not act to etch the $2^{nd}$ barrier layer 54 and/or the lower wiring layer 53; such organic solution as xylene category solution, Keton, and alcohol.

Figure 8A:
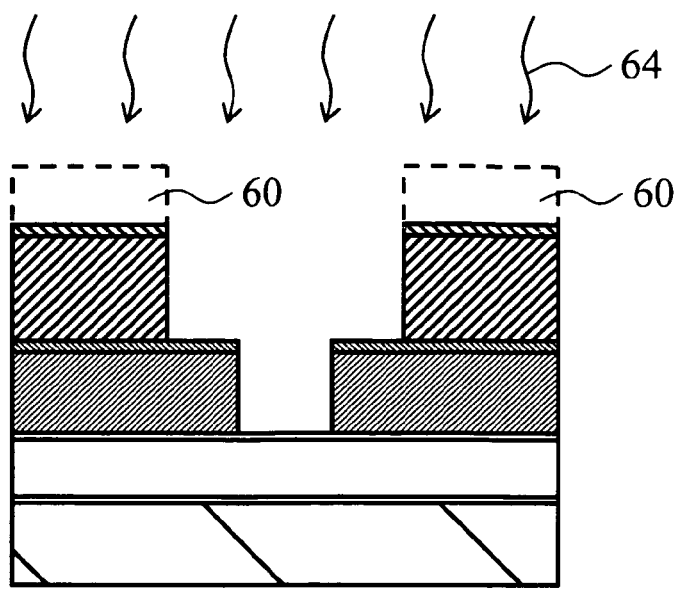
FIG. 8A-8C are process-wise cross sectional views following FIG. 7A-7C.
Figure 8B:
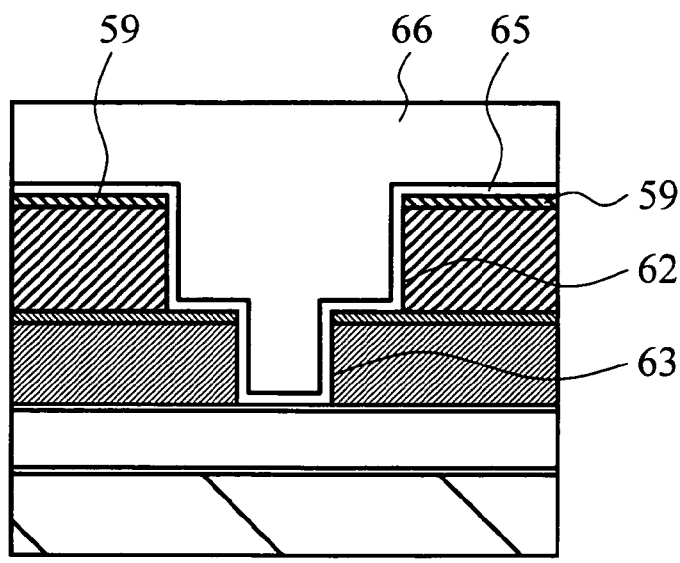
Figure 8C:
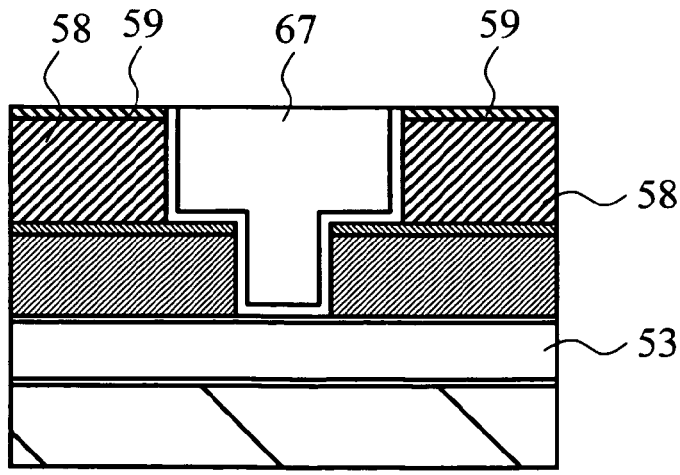

After removal of the modified layer 60a, the resist mask 60 is removed using the resist removing apparatus as shown in FIG. 5 referred in the 1st example. Here the resist mask 60 is removed by irradiation of hydrogen radical, for main substance of gas. (FIG. 8A)

Then, 3rd barrier layer 65 of tantalum nitride about 20 nm thick is formed onto the wiring trench 62, the inner wall of the via 63, and the surface of the 2nd protection insulating film 59. And, a Cu film 66 of about 1 µm is formed over the layer 65 by generally known plating method.

Subsequently, by widely known CMP method, polished and removed are Cu film 66, a part no longer required, over the 2nd protection insulating film 59 and also the 3rd barrier layer 65. In this CMP process, the 2nd protection insulating film 59 functions as CMP stopper and protects the 2nd MSQ film 58 from CMP. Thus, a damascene wiring layer 67 is made out connecting to the base wiring layer 53. (FIG. 8A)

AS seen from above explanation, the example 2 of embodying this invention in using low dielectric constant insulating films for an ILD, features the preliminary removal by chemical solution of the modified layer formed in the process to remove a resist mask, and features subsequent removal of the residue of resist mask by irradiation of hydrogen radical.

In the case of the example 2, the smaller thermal modification of the modified layer is, the more quickly the method works, and no resist residue can be left in high repeatability and stability. In this case, chemical solution is applied for removing the modified layer, and not plasma irradiation. Therefore, when dielectric constant of low dielectric constant insulating films becomes as small as about 2 (two), dielectric constant of an ILD can be maintained that small, two (2.0), after removal of the resist mask. For instance, in case of the ILD for dual damascene wiring structure as referred in FIGS. 7 and 8, if a porous MSQ film of dielectric constant of two (2.0) is used, dielectric constant of the film remains two (2.0). In contrast, in the example 1, if dielectric constant of a low dielectric constant insulting film becomes as small as two (2), it might happen by a case that dielectric constant increases by 10% approximately.

Thus, the method of removing resist in the embodying example 2 also offers ample practicability for manufacture of semiconductor devices. In this case as well, forming damascene (dual) wiring structure of small parasitic capacitance becomes easier using an ILD of dielectric constant less than three (3), whereby promoted will be practical and general use of high processing speed and high performance semiconductor devices.

Whereas expatiated is in above referring to the drawings, specific configuration of apparatus, material, or methods in detail is not limited to those specified in the examples indicated above in embodiment of this invention. Variation of design and others that does not deviate from the principle and the principle concept of this invention are included in this invention. For instance; while in the embodying example here described, explained is the case of forming an ILD for wiring structure by dry etching of a MSQ film, which is a representative example of low dielectric constant insulating films, siloxane backbone insulating films containing organic components, this invention is applicable in the same way to the cases forming an ILD using a silsesquioxane-related insulating film or an inorganic insulating film such as SiOC film for manufacturing semiconductor devices. And, this invention is furthermore effectively applicable to form an ILD using low dielectric constant insulating films of organic polymer for main chain.

Whereas in the embodying example indicated above, explained in the case of using SiC film for a protection insulating film, but application is not limited to SiC; a SiOC film can be used alternatively as well.

Furthermore, this invention is perfectly applicable to a case of removing a resist mask used for impurity ion implantation into a silicon substrate through an ILD consisting of low dielectric constant insulating films, reason being if dosage amount is increased, a modified layer is formed on the surface of a resist mask. Such a resist mask used for impurity ion implantation is frequently used for manufacturing semiconductor devices, of which an instance is a ROM (including multivalue) composed of a piece of MOSFET.

Finally, on the top of the above explained, this invention is suitably applicable to the cases other than creating semiconductor devices on silicon substrates; such others as GaAs substrates and GaN substrates.

And, the invention can be applied to make wiring structure on a liquid crystal panel and a plasma display; also to process insulating material such as a prepreg for a multilayer wiring board used for surface mounting of semiconductor devices. Thus, application of this invention is not limited to the cases described as the examples, and mode of embodiments can be suitably modified within the scope of technology concept of this invention.

What is claimed is:

1. A method of removing a resist used as a mask for patterning a substrate for processing, said method comprising the steps of:
   Removing, by etching, the surface of said resist with a reactive species created by plasma excitation of a first processing gas including $NH_3$, said surface being modified during said patterning; and
   subsequently removing all remaining resist by etching with a hydrogen active species created by plasma excitation of a second processing gas, said processing gas including a hydrogen gas.

2. The method of claim 1 wherein said hydrogen species are a plurality of hydrogen radicals.

3. The method of claim 1 wherein said second processing gas is a mixture of hydrogen gas and an inert gas 4. The method of claim 1, wherein said substrate for processing is placed in a temperature set in a range of 200° C. to 400° C. for etching by use of said hydrogen active species.

5. The method of claim 1, wherein the first processing gas also includes at least one of a nitrogen gas, an oxygen gas, a carbon tetrafluoride ($CF_4$) gas, a hydrogen gas and a mixture of these gases onto said surface.

6. The method of claim 1, wherein the surface of said resist, modified due to said patterning, is removed by immersion of said substrate for processing in a chemical liquid including an organic solution.

7. The method of claim 1, wherein the surface of said resist is modified due to an etching process of a low dielectric constant insulating film, said dielectric constant is three (3) or less, said low dielectric constant insulating film being formed on the surface of said substrate for processing.

8. The method of claim 1, wherein the surface of said resist is modified due to an etching process of a metal film on said low dielectric constant insulating film of which dielectric constant is three (3) or less, said low dielectric constant insulating film being formed on the surface of said substrate for processing.

9. A method of manufacturing a semiconductor device comprising the steps of:
   forming an insulating film of low dielectric constant on a surface of a substrate for processing;
   forming a resist on a surface of said low dielectric constant insulating film;
   forming a pattern on said resist by lithography;
   forming the pattern by etching said low dielectric constant film by use of the pattern of said resist;
   removing a surface part formed on the surface of said resist with a reactive species created by plasma excitation of a first processing gas including $NH_3$; and
   subsequently removing all remaining resist by etching with a hydrogen active species created by plasma excitation of a second processing gas including a hydrogen gas.

10. The method of claim 9 wherein said hydrogen active species are a plurality of hydrogen radicals.

11. The method of claim 9 wherein said second processing gas is a mixture of a hydrogen gas and an inert gas.

12. The method of claim 9 wherein said substrate for processing is placed in a temperature being set in a range of 200° C. to 400° C. for etching by use of said hydrogen active species.

13. The method of claim 9 wherein the first processing gas also includes at least one of a nitrogen gas, an oxygen gas, a carbon tetrafluoride ($CF_4$) gas, a hydrogen gas, and a mixture of said gas onto said surface.

14. The method of claim 9 wherein the surface of said resist, said surface being modified by said patterning, is removed by immersion of said substrate for processing in a chemical liquid including an organic solution.

15. The method of claim 9 wherein the surface of said resist is modified because of etching process of a low dielectric constant insulating film of which dielectric constant is three (3) or less, said low dielectric constant insulating film being formed on the surface of said substrate for processing.

16. The method of claim 9 wherein, the surface of said resist is modified because of etching process of a metal film formed on a low dielectric constant insulating film which dielectric constant is three (3) or less, said low dielectric constant insulating film being formed on the surface of said substrate for processing.

17. A semiconductor device manufactured by a method comprising the steps of:

patterning a substrate for processing, on which a low dielectric constant layer is formed by use of a resist coated onto a surface of said substrate for processing;

removing, by etching, a surface of said resist with an active species created by plasma excitation of a first processing gas including $NH_3$, the surface being modified by said patterning; and subsequently removing all remaining resist by etching with a hydrogen active species created by plasma excitation of a second processing gas including a hydrogen gas;

wherein said low dielectric constant insulating film is an inter layer dielectric (ILD) of a multilayer interconnect wiring structure for interconnection of a plurality of semiconductor elements.

18. The semiconductor device of claim 17, wherein said inter layer dielectric(ILD) is an inter layer dielectric(ILD) of at least one of a damascene and a dual damascene wiring structure configured to interconnect the plurality of semiconductor elements.

* * * * *